(12) United States Patent
Lu

(10) Patent No.: US 6,810,579 B2
(45) Date of Patent: Nov. 2, 2004

(54) METHOD FOR MANUFACTURING MEMBRANES

(75) Inventor: Tien-Min Lu, Hsien-Tien (TW)

(73) Assignee: Shin Jiuh Corp., Hsin-Tien (TW)

(*) Notice: Subject to any disclaimer, the term of this patent is extended or adjusted under 35 U.S.C. 154(b) by 114 days.

(21) Appl. No.: 10/207,988

(22) Filed: Jul. 31, 2002

(65) Prior Publication Data

US 2004/0020031 A1 Feb. 5, 2004

(51) Int. Cl.⁷ .................. H01H 11/00; H01H 11/02; H01H 11/04; H01H 65/00
(52) U.S. Cl. .................. 29/622; 29/450; 29/846; 345/168; 341/20
(58) Field of Search .................. 29/622, 450, 846; 345/168; 341/20

(56) References Cited

U.S. PATENT DOCUMENTS 4,920,342 A * 4/1990 Gratke .................. 341/22
5,520,323 A * 5/1996 Hauner et al. .................. 228/254
6,630,927 B2 * 10/2003 Sherman et al. .................. 345/168

* cited by examiner

*Primary Examiner*—Carl J. Arbes
*Assistant Examiner*—Tim Phan
(74) *Attorney, Agent, or Firm*—Birch, Stewart, Kolasch & Birch, LLP

(57) ABSTRACT

A method for manufacturing membranes after having defined the button key position circuit and matrix layout under the conditions of without jumping and without generating ghost keys includes the steps of: heating and preshrinking the PET of a membrane, printing a circuit made from silver paste on the membrane, printing an insulation layer on the printed silver paste circuit or printing carbon powders, folding the membrane and welding the membrane by supersonic wave, and finally punching structural holes on the membrane to complete the membrane production.

7 Claims, 6 Drawing Sheets

METHOD FOR MANUFACTURING MEMBRANES

FIELD OF THE INVENTION

The present invention relates to a method for manufacturing membranes and particularly a method for manufacturing membranes after having defined the button key position and matrix layout under the conditions of without jumping and without generating ghost keys.

BACKGROUND OF THE INVENTION

The keyboards now being used on the notebook computers generally include a membrane in addition to the button keys on the upper layer, base plate and frame. To make the membrane, a button key configuration layout has to be defined and formed first by the vendor. Then the layout definition is transferred to manufacturers to make a matrix configuration (as shown in FIG. 1). Each button key position has a code to be built into the chip.

The membrane is made according to the finished matrix configuration of the button key position set forth above. In the manufacturing processes of the membrane, first, the membrane PET is heated and pre-shrunk, then a circuit made from a silver paste is printed on the membrane, an insulation layer is printed on the silver paste printed circuit, then a cover layer is printed on the insulation layer, then silver paste of jumping is printed on the cover plate, another insulation layer is printed on the jumping and carbon powders are printed, finally the membrane is folded and welded by supersonic wave, and structural holes are punched to complete the membrane production.

Production of the membrane with the jumping set forth involves many printing operations. Thus manufacturing processes are complex, production cost is higher, yield is lower, and defect rate is greater. In addition, the jumping portion generates a circuit ionization phenomenon and results in greater micro short circuit. The reliability of the product becomes lower. Moreover, the print position of the jumping is prone to form uneven membrane thickness and affects key in operation.

Furthermore, when the keyboard made by the aforesaid method is in use, the microprocessor located inside the keyboard constantly scans the matrix to check whether the key has been pushed downwards. In the event that composite keys are depressed (i.e. the composite keys means three keys have been depressed simultaneously), the microprocessor scans the depressed composite keys and usually mistakenly deems a fourth key is also being depressed (as shown in FIG. 5). As a result, a ghost key signal is generated and an additional character appears in the character string on the display screen. It causes inconvenience to users.

SUMMARY OF THE INVENTION

Therefore the primary object of the invention is to resolve the aforesaid disadvantages. The invention aims at providing a method for manufacturing membranes without jumping to reduce print operations and production cost, increase yield, simplify manufacturing processes, reduce defects and loss, and prevent circuit ionization phenomenon on the jumping portion and micro short circuit. The membrane made according to the method of the invention also has enhanced reliability and an even thickness to facilitate key in operation.

To achieve the foregoing object, the method of the invention includes: defining the button key position circuit and matrix layout under the conditions of without jumping and without generating ghost keys, heating and pre-shrinking the PET of the membrane, printing a circuit made from silver paste on the membrane, printing an insulation layer on the printed silver paste circuit or printing carbon powders, folding the membrane and welding the membrane by supersonic wave, and finally punching the membrane to form structural holes to complete the membrane production.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
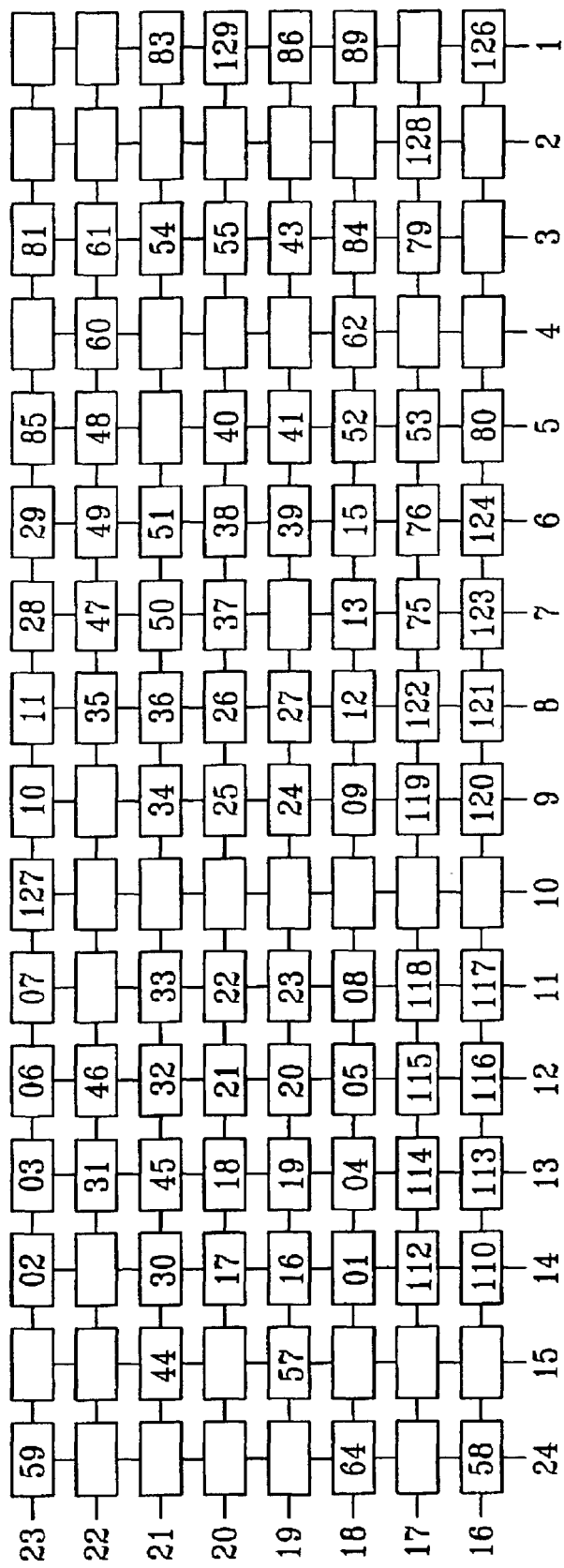
FIG. 1 is a schematic view of a conventional matrix configuration layout.
Figure 2:
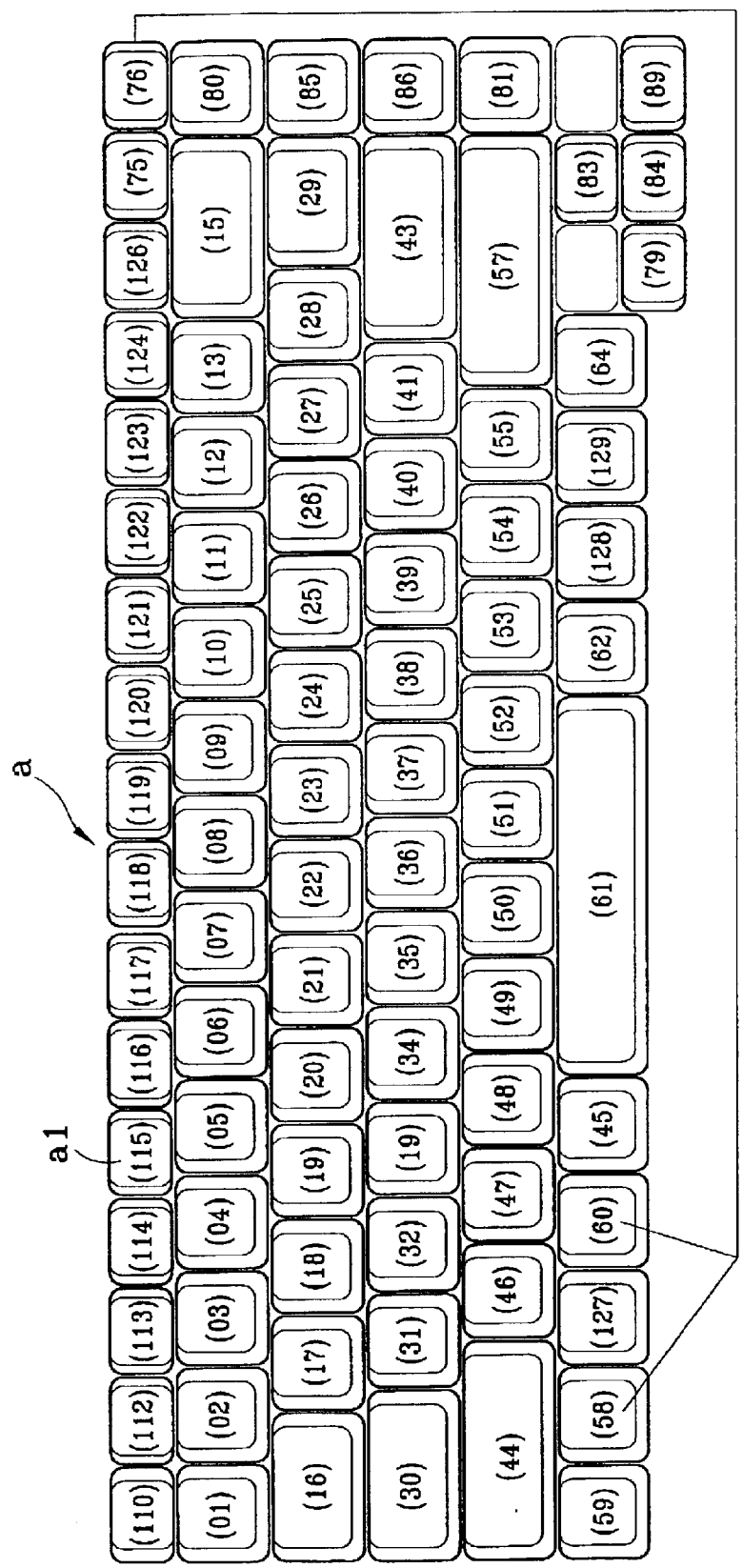
FIG. 2 is a schematic view of a button key layout of the invention.
Figure 3:
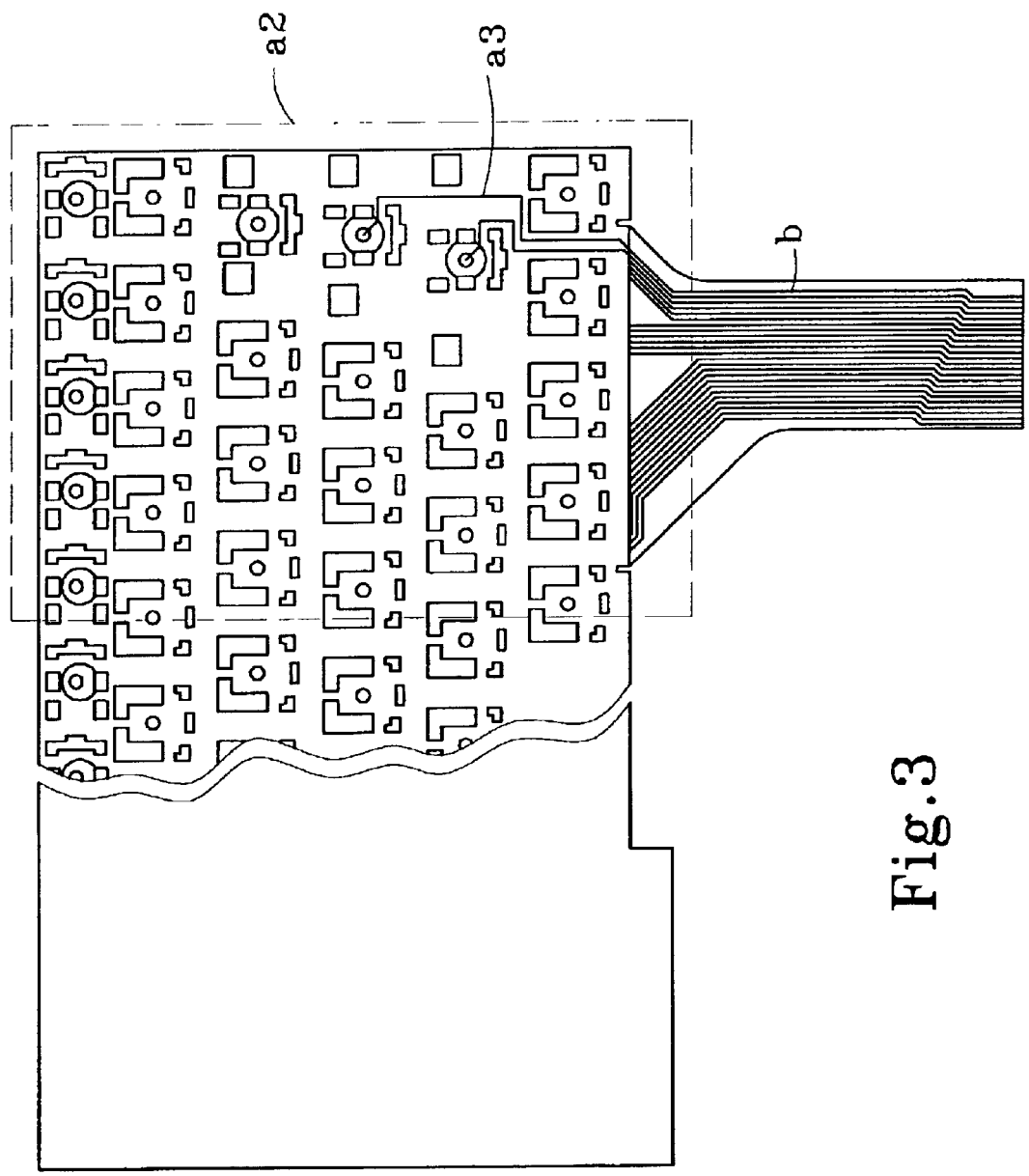
FIG. 3 is a fragmentary schematic view of a membrane of the invention.

Referring to FIGS. 2 and 3, the method for making the button key layout on a membrane according to the invention mainly includes: making a circuit layout under the conditions of without jumping and without generating ghost keys, defining a matrix configuration, and providing a code for each key position to enable vendors to build into the chip. By means of the method set forth above, print operations and production cost of the membrane may be reduced, yield increases, manufacturing processes are simplified, defects and loss are reduced, and circuit ionization phenomenon on the jumping portion and micro short circuit may be prevented, product reliability is enhanced and uneven thickness resulting from the jumping can be avoided to facilitate key in operation.

First, in order to design the multi-layer membrane layout without the jumping, a button key configuration chart a is defined. The button key configuration chart a gathers adjacent keys a1 into a cluster a2. Through the design of the multi-layer membrane, the circuit a3 of each key a1 in the cluster a2 is linked to a flat cable b of the membrane. The construction thus formed can overcome the jumping problem.

Figure 4:
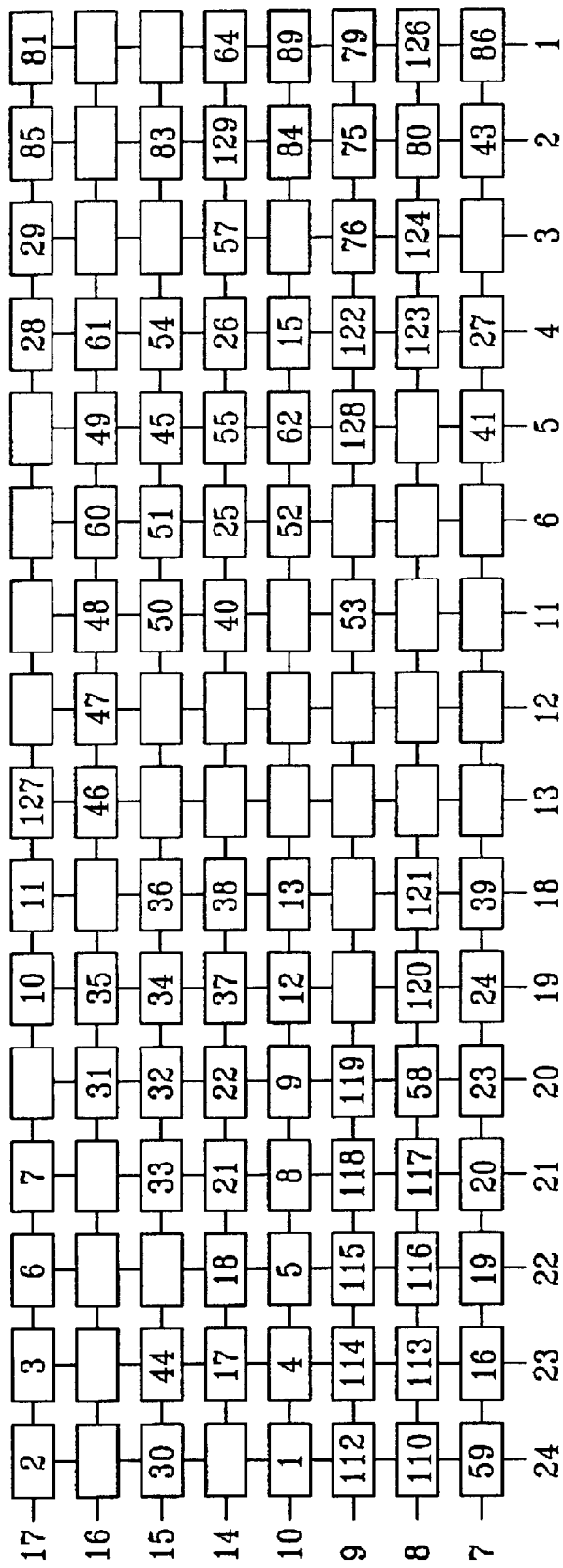
FIG. 4 is a schematic view of a button key matrix layout of the invention.

Refer to FIGS. 2 and 4 for the button key configuration and the matrix layout of the button key positions of the invention. As shown in the drawings, after the design of the button key configuration chart a is completed, process the scanning matrix layout which enables users to depress the composite keys c without producing the output signal of the ghost key to prevent users from entering wrong characters. Before making the matrix layout, every key a1 in the button key configuration chart a is assigned with a code ranged from, but not limited to, 01 to 126. The code represents the position of each key a1 to be built. In the codes shown in the button key configuration chart a, some numbers not appeared are to be used for different country languages. In addition, the matrix layout is directly mapped into the x and y array of the scanning matrix. During mapping, first, define various types of composite keys c, then lay the keys a1 in the composite keys c that cannot be co-linear or cross co-linear, then sequentially map the remaining keys on the x and y axes of the matrix.

The composite keys c are two or more button keys that should be concurrently executed when users operate the keyboard to perform and display some special functions, characters (languages), data or notations on the screen. For instance, when the computer is restarted, users execute CTRL, ALT and DEL button keys. When the composite key c is executed, the computer automatically restarts initialization. Or when the button keys SHIFT, ALT and D are depressed, the character string of the current date will be displayed on the computer screen. Therefore, when mapping the matrix, the two button keys CTRL and ALT, or SHIFT and ALT should not be arranged on the same X-axis or Y-axis scan line; or button keys CTRL, ALT and DEL, or SHIFT, ALT and D should not be arranged in cross co-linear. Otherwise when the three button keys are depressed, the microprocessor scans the X and Y axes of the matrix, a four button key will be mistakenly deemed by the microprocessor as being depressed, and a ghost key signal will be generated and output, and an additional character will be displayed in the character string on the computer screen. As this additional character is not the function, character, data or notation required by the user, the user has to execute or operate another button key to delete the additional character. It causes inconvenience to user operation.

Figure 5:
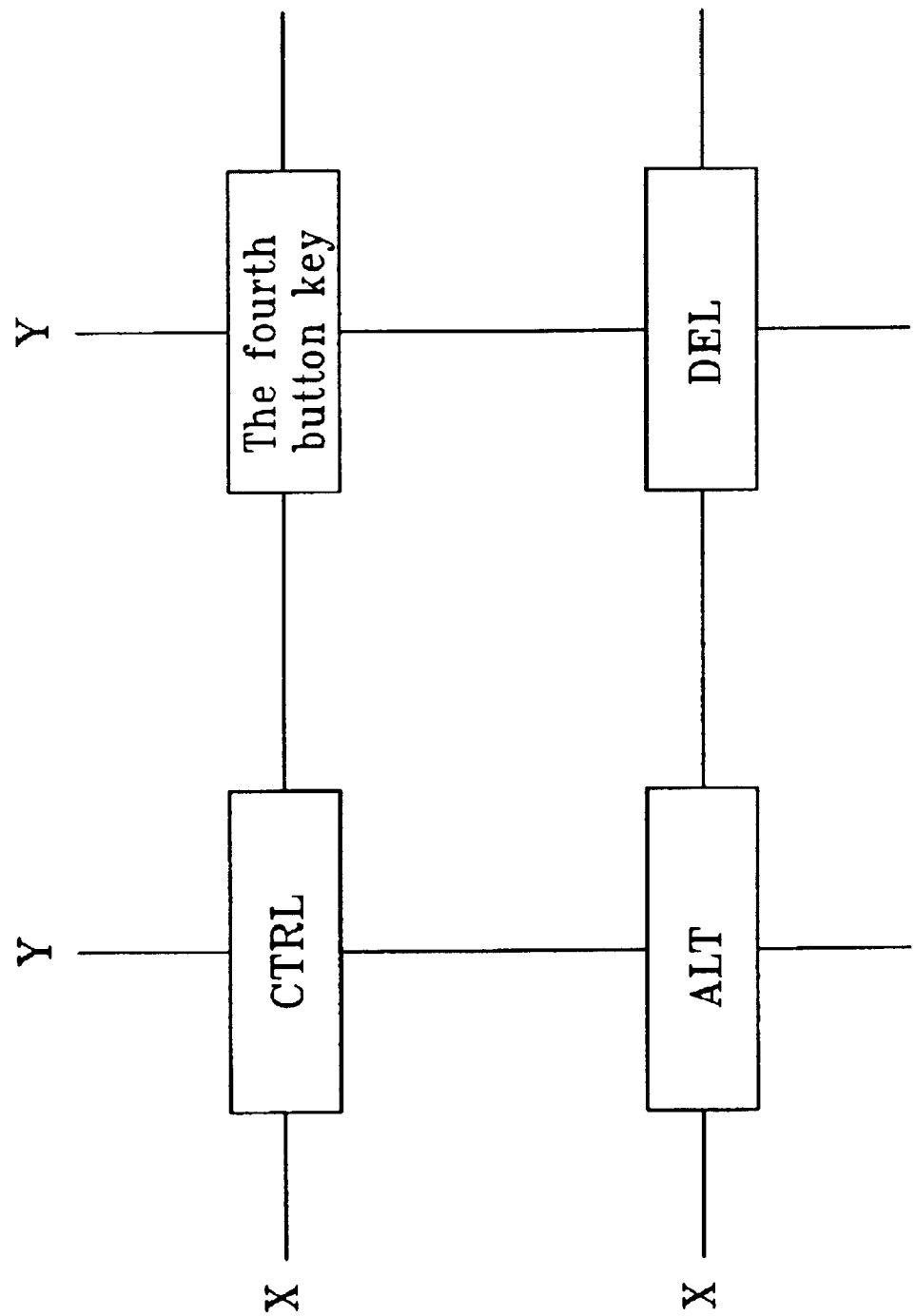
FIG. 5 is a schematic view of a cross co-linear portion for CTRL, ALT and DEL keys.

Refer to FIG. 5 for the cross co-linear of button keys CTRL, ALT and DEL. This is to show why the button keys CTRL and ALT, or SHIFT and ALT should not be arranged on the same X-axis or Y-axis scan line; or button keys CTRL, ALT and DEL, or SHIFT, ALT and D should not be arranged in cross co-linear. When button keys CTRL, ALT and DEL are depressed concurrently, the microprocessor scans the matrix, a four button key will be mistakenly deemed as being depressed, and a ghost key signal will be generated and output, as a result, an additional character will be displayed in the character string on the computer screen. This additional character will cause inconvenience to user operation.

After the configuration of the composite keys c is finished, map the configuration layout for other button keys a1. After the button key configuration chart a and the matrix layout have been completed, transfer these two items to vendors for building the code of every button key into the chip to complete membrane production that does not have jumping or does not generate ghost key signals.

Figure 6:
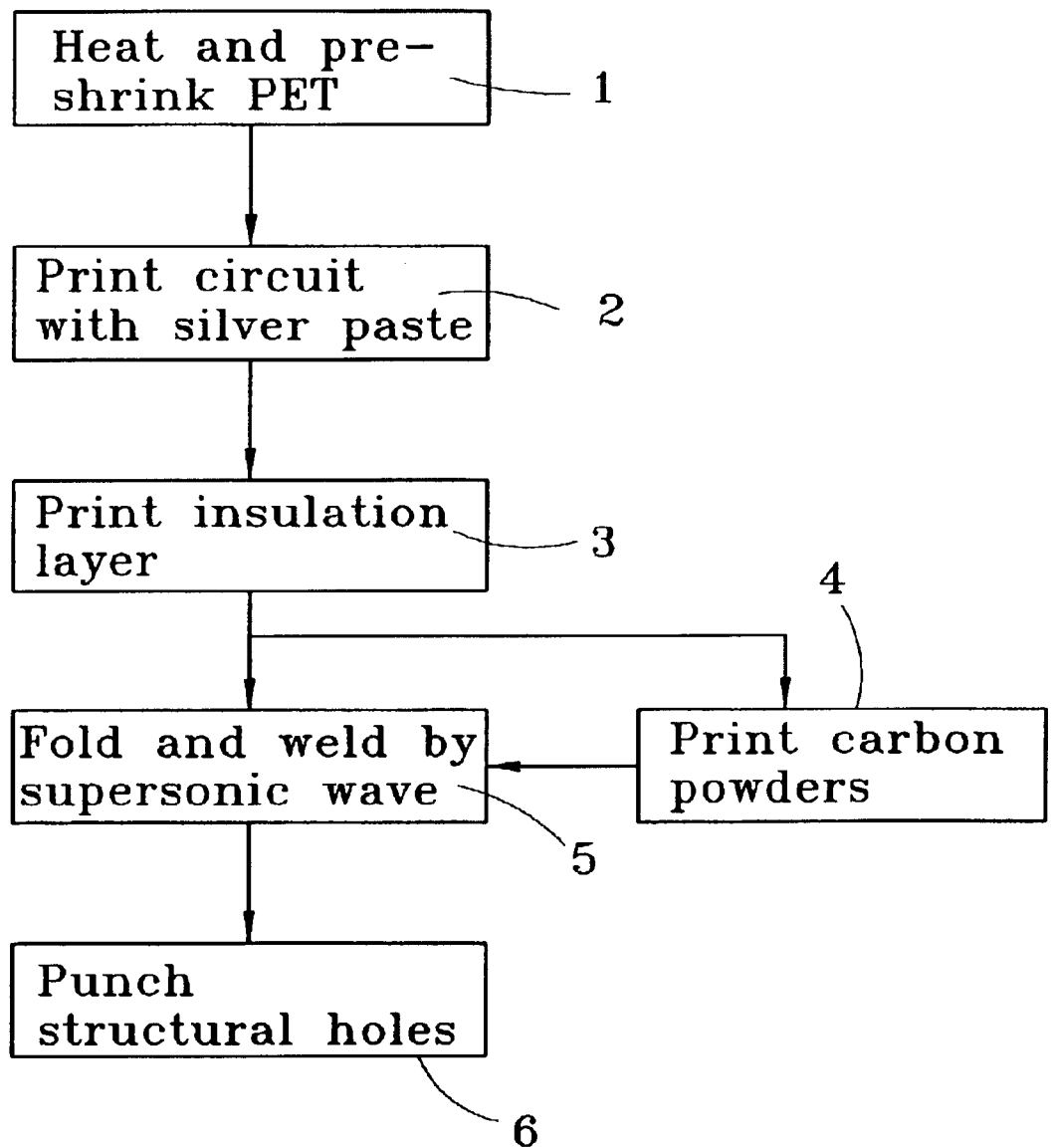
FIG. 6 is a flow chart of manufacturing processes for the membrane of the invention.

Refer to FIG. 6 for the manufacturing processes for the membrane of the invention. To make the membrane according to the conditions set forth above, first, heat and pre-shrink the PET of the membrane 1, then print a circuit made from silver paste on the membrane 2, print an insulation layer 3 on the printed silver paste circuit or print carbon powders 4, fold the membrane and weld the membrane by supersonic wave 5, and finally punch the membrane to form structural holes 6 to complete the membrane production.

The membrane made under the conditions of without jumping and without generating ghost keys set forth above can save a lot of manufacturing processes than conventional techniques. Production can be accomplished with less time, fewer operations and at a reduced cost.

What is claimed is:

1. A method for manufacturing a membrane, comprising the steps of:

defining key position circuits and matrix layout conditions including defining composite keys, arranging composite keys that cannot be co-linear or cross co-linear in the matrix layout and sequentially mapping remaining keys in the matrix layout;

heating and pre-shrinking the PET of the membrane;

printing a circuit made from silver paste on the membrane;

printing an insulation layer on the printed silver paste printing an insulation layer on the printed silver paste circuit;

folding the membrane and welding the membrane by supersonic wave directly after the steps of printing a circuit and printing an insulation layer; and punching structural holes on the membrane.

2. The method of claim 3, wherein the step of printing an insulation layer is followed by a step of printing a layer of carbon powders.

3. The method of claim 1, wherein a printing of jumping made from silver paste is not performed before the step of folding the membrane.

4. The method according to claim 1, wherein ghost keys are not generated in the step of defining key position circuits and matrix layout conditions.

5. The method of claim 1, wherein the step of defining key position circuits and matrix layout conditions includes gathering adjacent keys into a cluster and linking each key in a cluster to a flat cable.

6. The method of claim 1, wherein comprise keys which are depressed together are not arranged on the same X-axis or Y-axis scan line.

7. The method of claim 1, wherein composite keys which are depressed together are not arranged in cross co-linear arrangement.

* * * * *